US012641715B2

(12) United States Patent
Kim et al.

(10) Patent No.: US 12,641,715 B2
(45) Date of Patent: May 26, 2026

(54) LARGE AREA MONITORING APPARATUS

(71) Applicants: WIT CORPORATION, Hwaseong-si (KR); FINE SEMITECH CORP., Hwaseong-si (KR)

(72) Inventors: Jae Hwan Kim, Hwaseong-si (KR); Jae Won Oh, Gunpo-si (KR)

(73) Assignees: WIT CORPORATION, Hwaseong-si (KR); FINE SEMITECH CORP., Hwaseong-si (KR)

( * ) Notice: Subject to any disclaimer, the term of this patent is extended or adjusted under 35 U.S.C. 154(b) by 204 days.

(21) Appl. No.: 18/429,427

(22) Filed: Feb. 1, 2024

(65) Prior Publication Data

US 2024/0179833 A1 May 30, 2024

Related U.S. Application Data

(63) Continuation of application No. PCT/KR2022/015134, filed on Oct. 7, 2022.

(30) Foreign Application Priority Data

Oct. 12, 2021 (KR) ........................ 10-2021-0134695
May 6, 2022 (KR) ........................ 10-2022-0055983

(51) Int. Cl.
| | |
|---|---|
| *H05K 1/02* | (2006.01) |
| *H01J 37/32* | (2006.01) |
| *H05K 3/28* | (2006.01) |

(52) U.S. Cl.
CPC ...... *H05K 1/0271* (2013.01); *H01J 37/32733* (2013.01); *H05K 1/0218* (2013.01);
(Continued)

(58) Field of Classification Search
CPC .... H05K 1/0271; H05K 1/0218; H05K 3/284; H05K 2201/068; H05K 2201/09036;
(Continued)

(56) References Cited

U.S. PATENT DOCUMENTS

| | | | | |
|---|---|---|---|---|
| 8,666,505 | B2* | 3/2014 | O'Brien ................. | H01L 23/12 |
| | | | | 607/9 |
| 10,431,648 | B2* | 10/2019 | Wang ....................... | H10D 1/68 |
| 2018/0235544 | A1* | 8/2018 | Nagarkar ............... | C23C 14/34 |

FOREIGN PATENT DOCUMENTS

| | | |
|---|---|---|
| JP | S58-2812 A | 1/1983 |
| JP | 2004-507889 A | 3/2004 |

(Continued)

OTHER PUBLICATIONS

International Search Report of PCT/KR2022/015134, dated Jan. 6, 2023.

(Continued)

*Primary Examiner* — Binh B Tran

(57) ABSTRACT

A large area monitoring device for diagnosing easily performance of an equipment in a semiconductor process or a display process is disclosed. The monitoring device comprises a protection layer, a board disposed in an internal space of the protection layer, and at least one electrical element disposed on the board. Here, the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the board, material with different characteristics from the board is filled in the intaglio structure or the embossing structure is formed of material with different characteristics from the board.

17 Claims, 16 Drawing Sheets

(52) U.S. Cl.
CPC ...... *H05K 3/284* (2013.01); *H01J 2237/2007* (2013.01); *H05K 2201/068* (2013.01); *H05K 2201/09036* (2013.01); *H05K 2201/10151* (2013.01)

(58) Field of Classification Search
CPC ...... H05K 2201/10151; H01J 37/32733; H01J 2237/2007
USPC ........................................................ 361/748
See application file for complete search history.

(56) References Cited

FOREIGN PATENT DOCUMENTS

| | | | |
|----|----------------|---|---------|
| JP | 2016-072413 | A | 5/2016 |
| JP | 2020-500415 | A | 1/2020 |
| KR | 10-2015-0062556 | A | 6/2015 |
| KR | 10-2018-0050472 | A | 5/2018 |
| KR | 10-2018-0084877 | A | 7/2018 |
| KR | 1020190066193 | A | 6/2019 |
| KR | 10-2019-0130858 | A | 11/2019 |
| KR | 10-2021-0044334 | A | 4/2021 |

OTHER PUBLICATIONS

Written Opinion of the International Searching Authoriity of PCT/KR2022/015134, dated Jan. 6, 2023.

* cited by examiner

LARGE AREA MONITORING APPARATUS

CROSS-REFERENCE TO RELATED APPLICATIONS

This application is a continuation application of PCT application PCT/KR2022/015134, which was filed on Oct. 7, 2022, and which claims priority from Korean Patent Application No. 10-2021-0134695 filed with the Korean Intellectual Property Office on Oct. 12, 2021 and Korean Patent Application No. 10-2022-0055983 filed with the Korean Intellectual Property Office on May 6, 2022. The disclosures of the above patent applications are incorporated herein by reference in their entirety.

TECHNICAL FIELD

The disclosure relates to a monitoring device for measuring a large area.

BACKGROUND ART

A semiconductor and a display have been developed in a tendency of enlargement. It is important to keep a process uniformity of a semiconductor equipment or a display equipment when the semiconductor or the display is manufactured, in order to reduce defect. The process uniformity of the semiconductor equipment or the display equipment should be assured for each process, but performance of the semiconductor equipment or the display equipment may be changed as time goes by because up and down of temperature, on and off of RF power, up and down of pressure, etc. are innumerably repeated.

The change of the process generated in the semiconductor equipment or the display equipment causes defect of a wafer or a glass substrate. However, a technique for monitoring accurately the change of the process is nonexistent at present.

SUMMARY

The disclosure is to provide a large area monitoring device for diagnosing easily performance of an equipment in a semiconductor process or a display process.

A monitoring device according to an embodiment of the disclosure includes a protection layer; a board disposed in an internal space of the protection layer; and at least one electrical element disposed on the board. Here, the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the board, material with different characteristics from the board is filled in the intaglio structure or the embossing structure is formed of material with different characteristics from the board.

A monitoring device according to another embodiment of the disclosure includes a protection layer; a board disposed in an internal space of the protection layer; and at least one electrical element disposed on the board. Here, the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the protection layer, material with different characteristics from the protection layer is filled in the intaglio structure or the embossing structure is formed of material with different characteristics from the protection layer.

A monitoring device according to still another embodiment of the disclosure includes a protection layer; a board disposed in an internal space of the protection layer; at least one electrical element disposed on the board; and a member disposed outside the protection layer and configured to protect doubly the electrical element in company with the protection layer. Here, the electrical element includes one or more sensors, and the monitoring device monitors an object to be monitored by measuring at least one of a temperature, a slope, a light, a vibration, a voltage, current, a power or a pressure of the object located outside the monitoring device and a distance between the object and another element.

A monitoring device of the disclosure may enhance its flatness by forming an intaglio structure or an embossing structure on a printed circuit board or a protection layer. As a result, a temperature sensor disposed on the printed circuit board may locate closely to an object to be monitored, enhance a measuring accuracy by compensating horizontality of a vibration sensor and a displacement sensor disposed on the printed circuit board, prevent misalignment of an axis direction of the object and an RF sensor disposed on the printed circuit board, enhance a receiving sensitivity of light amount of an optical sensor disposed on the printed circuit board and enhance a transmitting/receiving sensitivity of a wireless communication device disposed on the printed circuit board.

Additionally, the disclosure may prevent breakdown of the monitoring device or a semiconductor equipment by preventing misalignment of an axis from a robot transferring automatically the monitoring device.

BRIEF DESCRIPTION OF DRAWINGS

Example embodiments of the disclosure will become more apparent by describing in detail example embodiments of the disclosure with reference to the accompanying drawings, in which:

Figure 2:
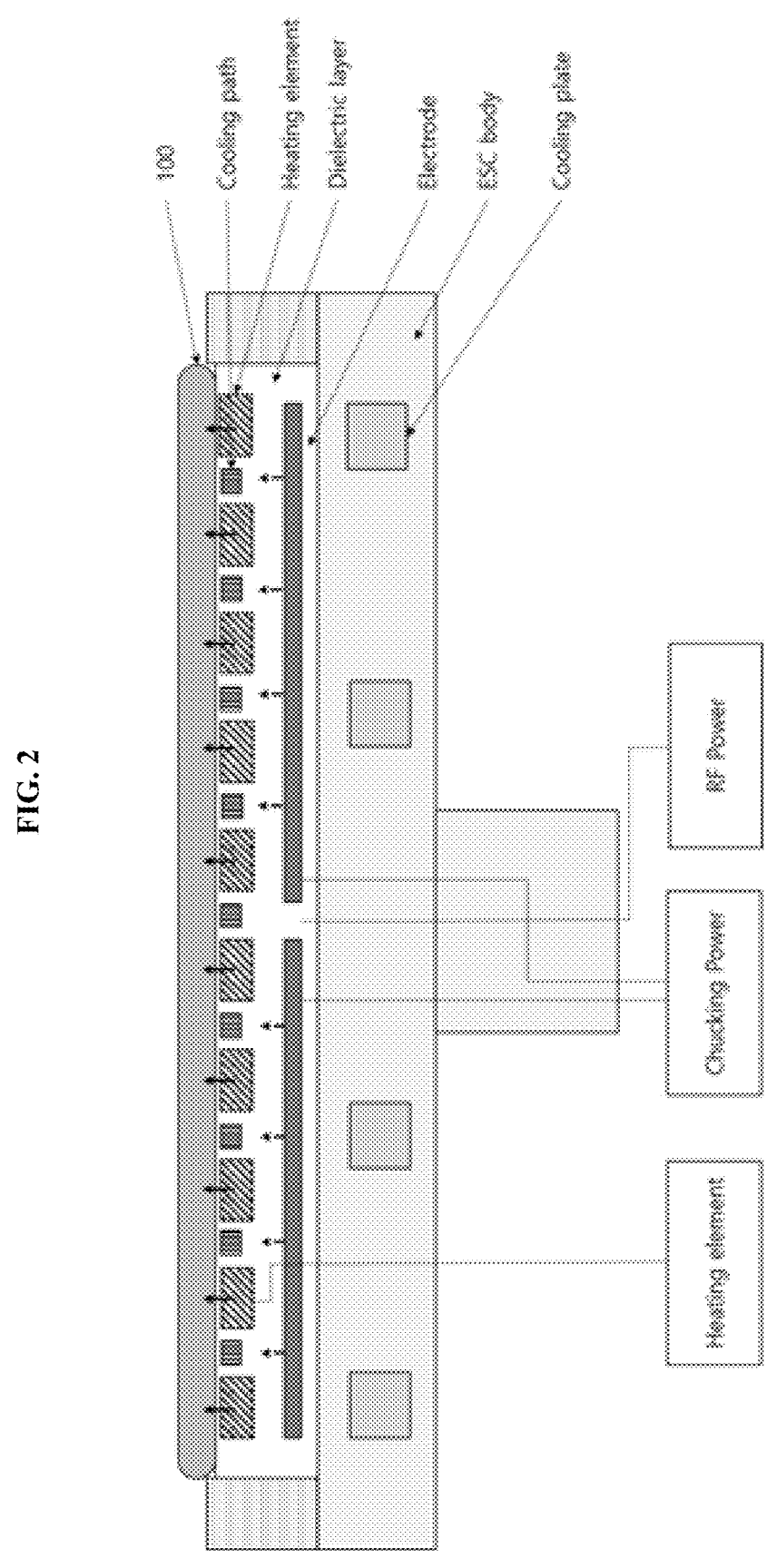

FIG. 2 is a view illustrating a monitoring device disposed on an electrostatic chuck according to an embodiment of the disclosure;

DETAILED DESCRIPTION

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements or operations may be further included. Also, terms such as "unit," "module," etc., as used in the present specification may refer to a part for processing at least one function or action and may be implemented as hardware, software, or a combination of hardware and software.

The disclosure relates to a monitoring device for diagnosing effectively an object to be monitored with a large area, and for example the monitoring device may monitor abnormalities of an electrostatic chuck used in a semiconductor process or a display process.

For example, the monitoring device may measure temperature, electrostatic force or slope of the electrostatic chuck.

For another example, the monitoring device may measure internal vibration of a semiconductor equipment or a display device or a distance between a shower head and the electrostatic chuck. For example, the monitoring device may monitor vibration of a wafer when the wafer is transferred by using a cassette.

For still another example, the monitoring device may measure voltage, current or power applied to the semiconductor equipment or the display device, or measure light amount of plasma in a semiconductor chamber or a display chamber.

In an embodiment, the monitoring device has a structure for monitoring effectively a large area. Particularly, the monitoring device may compensate a tensile strength, a compressive stress or a thermal stress by forming an intaglio structure or an embossing structure, and dispose a microprocessor, a wireless communication device, a wireless charging device, a sensor, etc. of a printed circuit board. As a result, electrical elements such as the wireless communication device, etc. may be effectively protected and contamination of an equipment may be minimized.

Hereinafter, various embodiments of the disclosure will be described in detail with reference to accompanying drawings.

Figure 1:
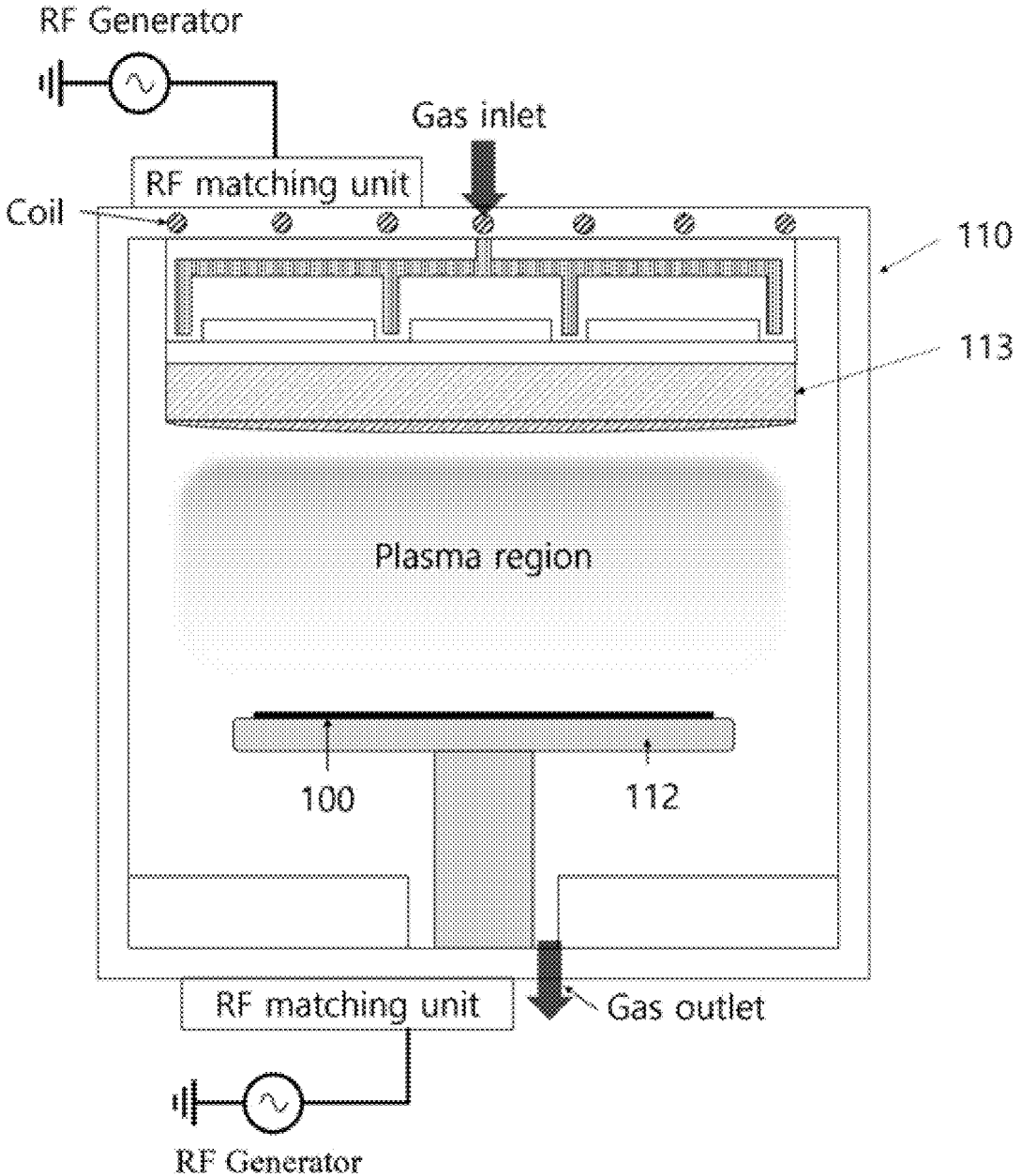
FIG. 1 is a view illustrating a monitoring device in a chamber according to an embodiment of the disclosure.
Figure 3:
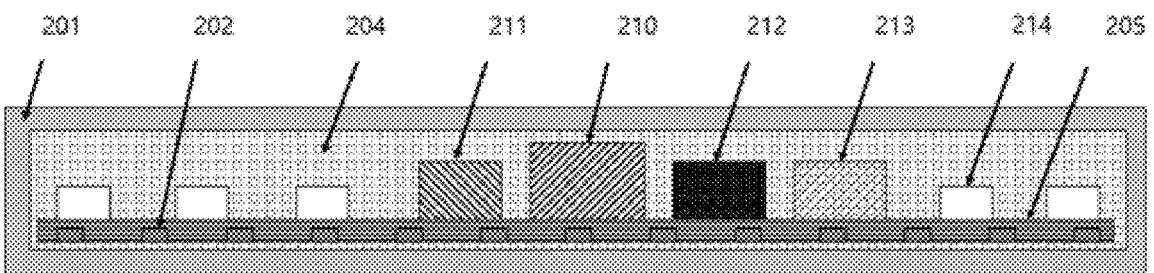
FIG. 3 is a view illustrating a monitoring device according to an embodiment of the disclosure.
Figure 10:
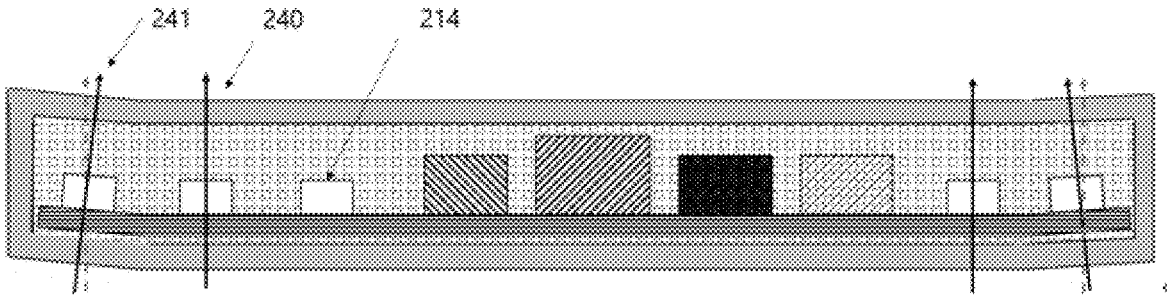
FIG. 10 is a view showing a problem occurred in a large area measuring system.
Figure 11:
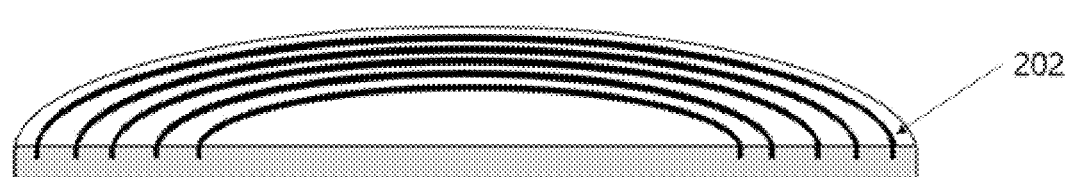
FIG. 11 is a view illustrating an intaglio structure or an embossing structure for reducing tensile strength and compressive stress.
Figure 11:
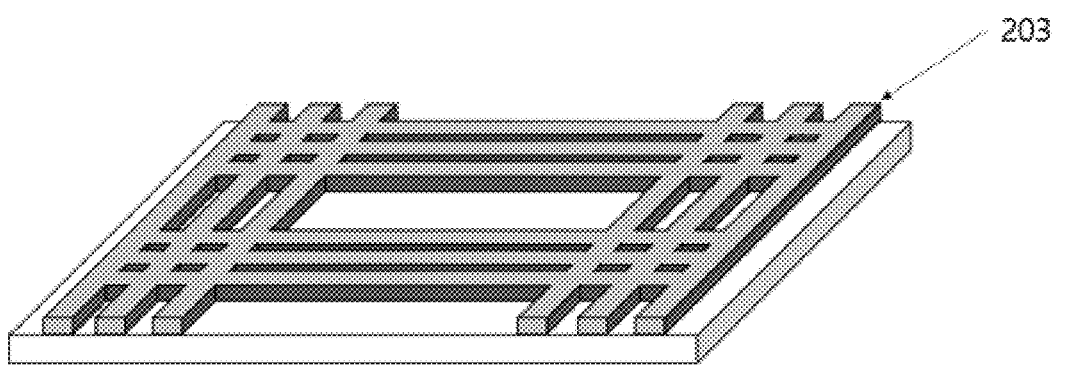
Figure 12:
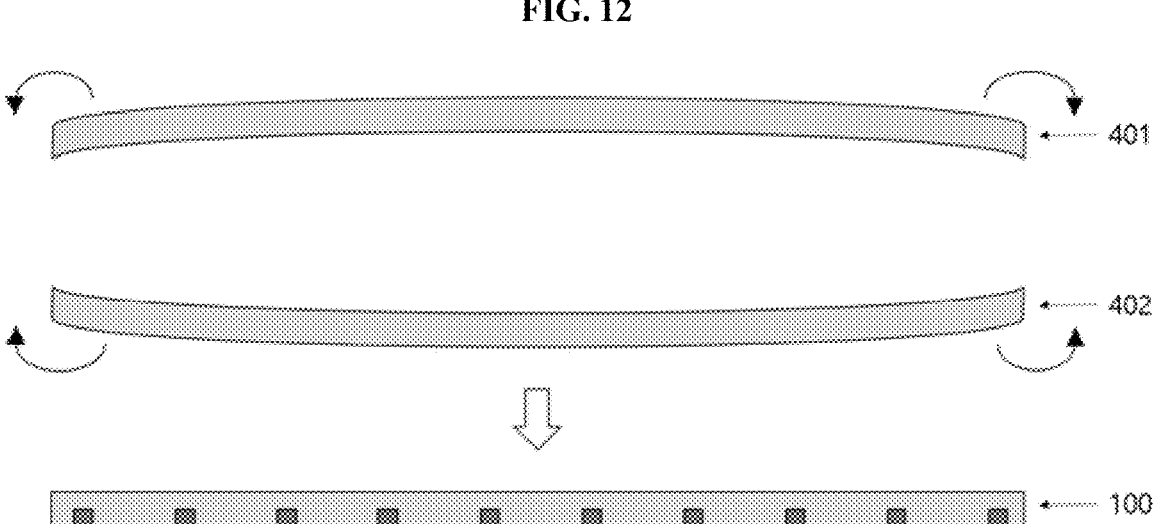
FIG. 12 is a view illustrating tensile strength or compressive stress occurred in a large area measuring device.
Figure 13:
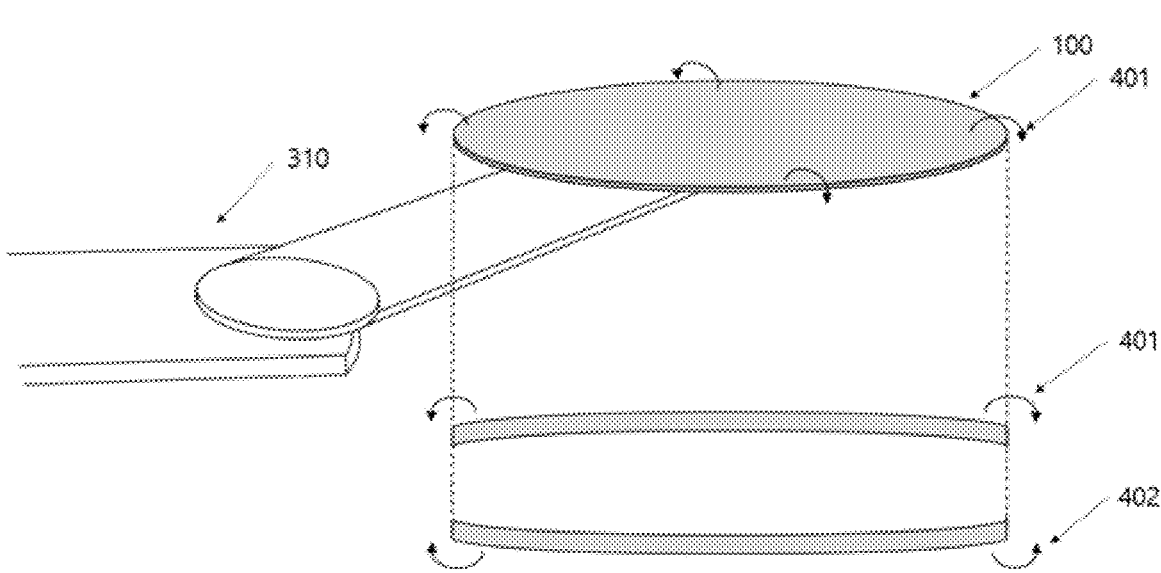
FIG. 13 is a view illustrating an example of error due to stress when a robot moves.
Figure 14:
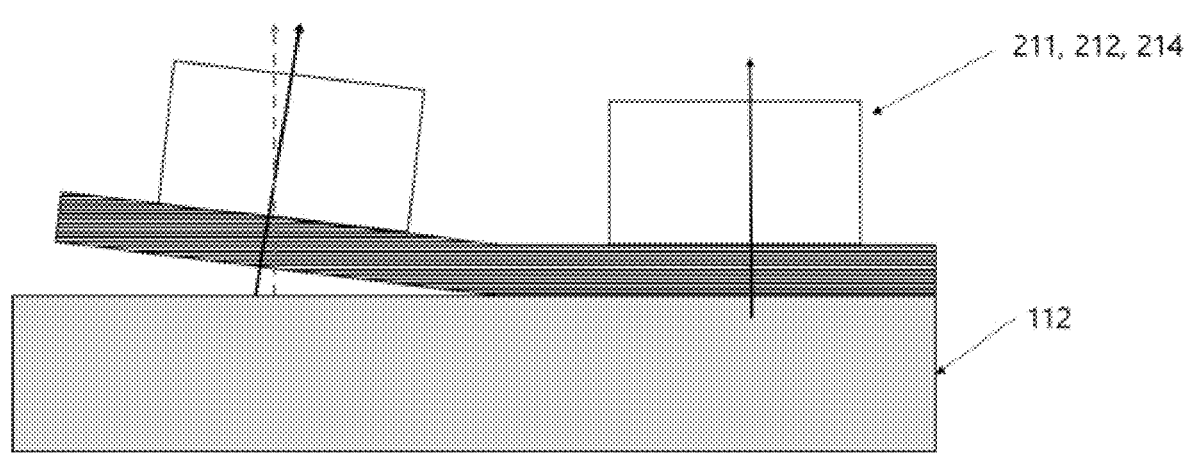
FIG. 14 to FIG. 16 are views showing reducing of a measuring accuracy due to tensile strength.
Figure 15:
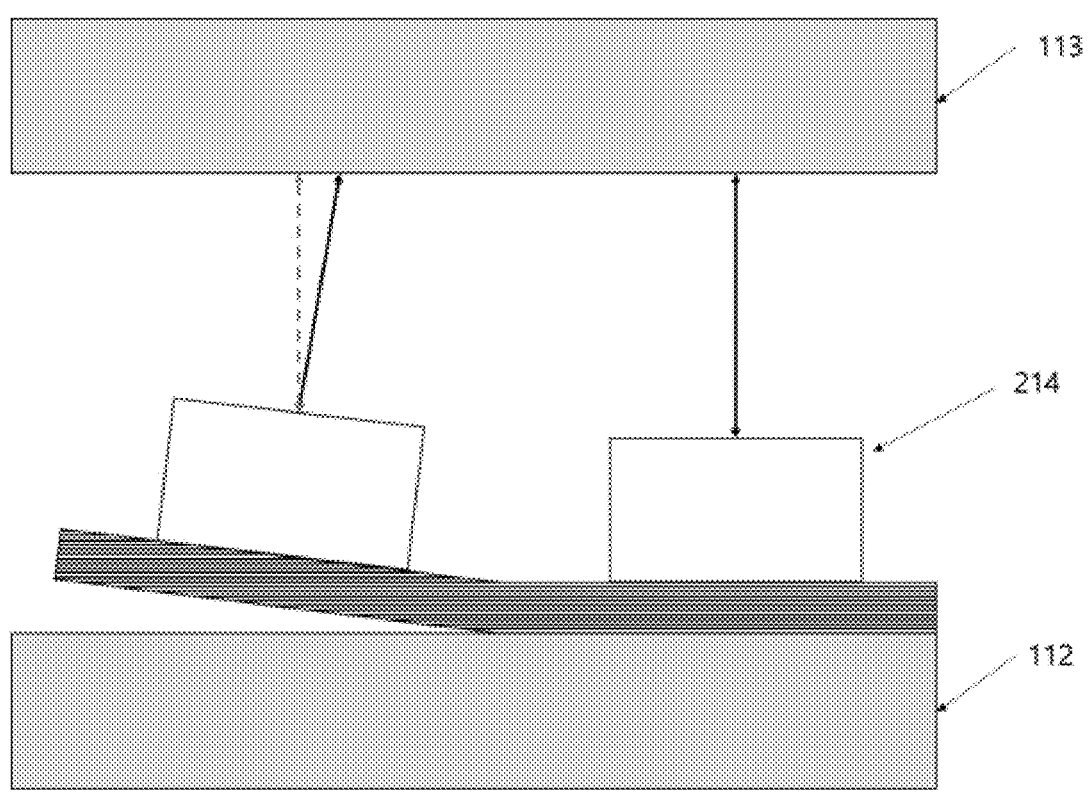
Figure 16:
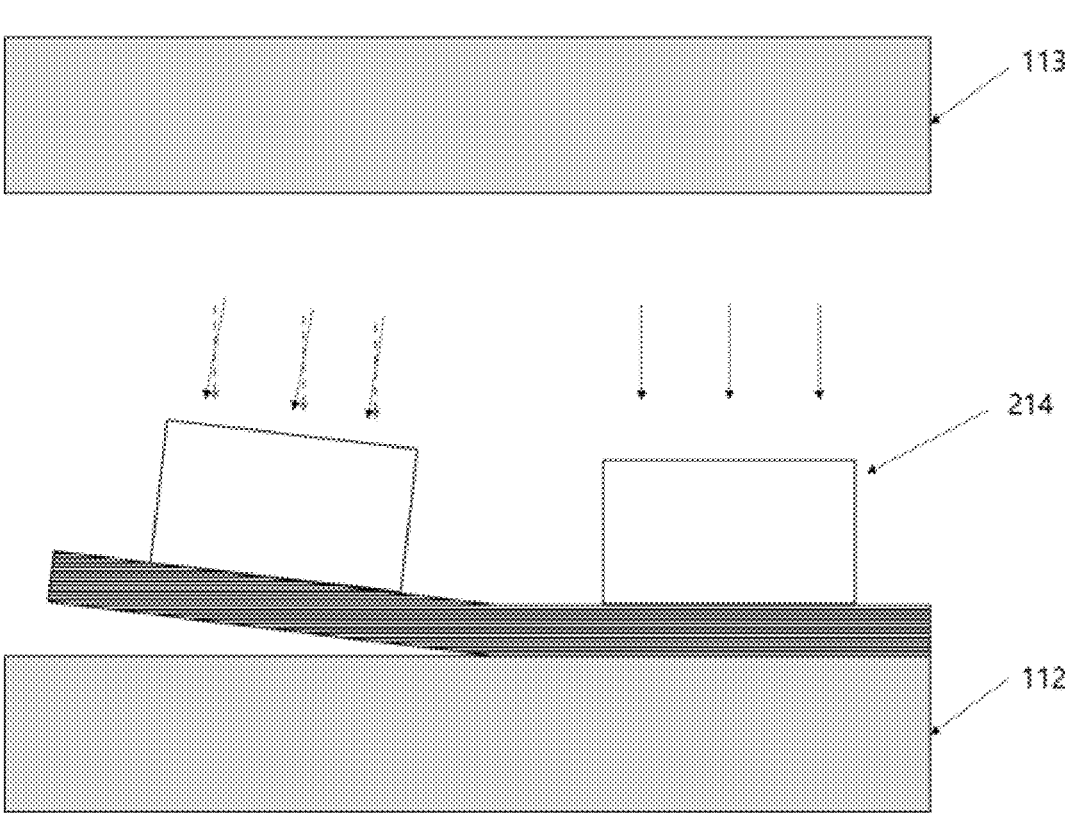

FIG. 1 is a view illustrating a monitoring device in a chamber according to an embodiment of the disclosure, and FIG. 2 is a view illustrating a monitoring device disposed on an electrostatic chuck according to an embodiment of the disclosure. FIG. 3 is a view illustrating a monitoring device according to an embodiment of the disclosure, and FIG. 4 to FIG. 9 are views illustrating a monitoring device according to another embodiment of the disclosure. FIG. 10 is a view showing a problem occurred in a large area measuring system, FIG. 11 is a view illustrating an intaglio structure or an embossing structure for reducing tensile strength and compressive stress, and FIG. 12 is a view illustrating tensile strength or compressive stress occurred in a large area measuring device. FIG. 13 is a view illustrating an example of error due to stress when a robot moves, and FIG. 14 to FIG. 16 are views showing reducing of a measuring accuracy due to tensile strength.

In FIG. 1, an electrostatic chuck 112 is formed at an inner lower part in a chamber 110 for performing a plasma process, and a monitoring device 100 may be disposed on a top surface of the electrostatic chuck 112.

The monitoring device 100 may check abnormalities of the electrostatic chuck 112 before a real process starts in the semiconductor process or the display process, the monitoring device 100 may be removed when the electrostatic chuck 112 is normal, and then the real process starts. For example, a wafer for an evaporation process, an etching process, an implant process or a photolithography process may be disposed on the electrostatic chuck 112 after the monitoring device 100 is removed.

In another embodiment, the monitoring device 100 may measure a distance between the electrostatic chuck 112 and a shower head 113.

In still another embodiment, the monitoring device 100 may measure RF voltage, current or power in the chamber 110.

In still another embodiment, the monitoring device 100 may measure vibration in the chamber 110.

In still another embodiment, the monitoring device 100 may measure optically characteristics of plasma in the chamber 110.

Hereinafter, a problem when a large area object is measured by using the monitoring device 100 and a method of solving the problem will be described in detail.

As shown in FIG. 12, a board of the monitoring device may be bent due to a compressive stress 401 and a tensile strength 402, depending on characteristics of material of the monitoring device. This bending of the board causes misalignment of a sensor 214 in the monitoring device as shown in FIG. 10, and so a measuring accuracy of the sensor 214, a performance of a wireless communication device 211 or a performance of the wireless charging device 212 for charging the power supply device 213 may be deteriorated.

Additionally, as shown in FIG. 14, the sensor 214 may not closely locate to the electrostatic chuck 112 due to the bending of the board, and thus a measuring accuracy of temperature may reduce.

Furthermore, an axis of the sensor 214 may be misaligned when a distance between the electrostatic chuck 112 and the shower head 113 is measured, thereby reducing a measuring accuracy.

Moreover, a radiation direction of RF power and a receiving direction of the sensor 214 may be misaligned as shown in FIG. 15, thereby reducing a measuring accuracy of RF voltage, current or power.

On the other hand, the monitoring device may be bent while the robot 310 transfers the monitoring device as shown in FIG. 13, thereby causing a malfunction of the monitoring device or breaking down the monitoring device.

To solve the problems, the monitoring device 100 may have a structure which can prevent its bending.

Particularly, the monitoring device 100 of the disclosure may include a printed circuit board 205 and at least one microprocessor 210, a wireless communication device 211, a wireless charging device 212, a power supply device 213 and at least one sensor 214 which are disposed on the printed circuit board 205. That is, plural electrical elements may be disposed on the printed circuit board 205.

In an embodiment, the printed circuit board 205 and the electrical elements may be disposed in a protection layer 201, and the printed circuit board 205 and the electrical elements may be covered by an electromagnetic wave blocking layer 204 in the protection layer 201. As a result, the electromagnetic wave blocking layer 204 may be formed on or below the printed circuit board 205 on which the electrical elements are disposed.

The protection layer 201 may block pollutant outputted from the monitoring device 100, prevent deterioration of performance and quality of the monitoring device 100 due to an outer factor such as heat, moisture, etc., and prevent impact and scratch by strengthening structurally a hardness of the monitoring device 100.

Furthermore, the protection layer 201 may compensate a measuring accuracy of the monitoring device 100 by adjusting a flatness and a roughness of its surface through a processing or a chemical polishing depending on a measured environment.

The monitoring device 100 may have a structure for preventing its bending or improving its flatness.

In FIG. 3, an intaglio structure 202 may be formed to the printed circuit board 205 and material with a stress opposed to the printed circuit board 205 may be filled in the intaglio structure 202 to compensate a stress of the printed circuit board 205, and so a flatness of the printed circuit board 205 may be improved. For example, the flatness of the printed circuit board 205 may be improved by filling material for enhancing a tensile strength in the intaglio structure 202 because a tensile strength of the printed circuit board 205 has reduced as temperature of the printed circuit board 205 increases.

In an embodiment, material such as metal including copper, aluminum, silver or gold, etc., silicon, silicon carbide or oxide, which has a heat conductivity higher than the printed circuit board 205, may be filled in the intaglio structure 202, thereby enhancing the tensile strength of the printed circuit board 205.

Figure 4:
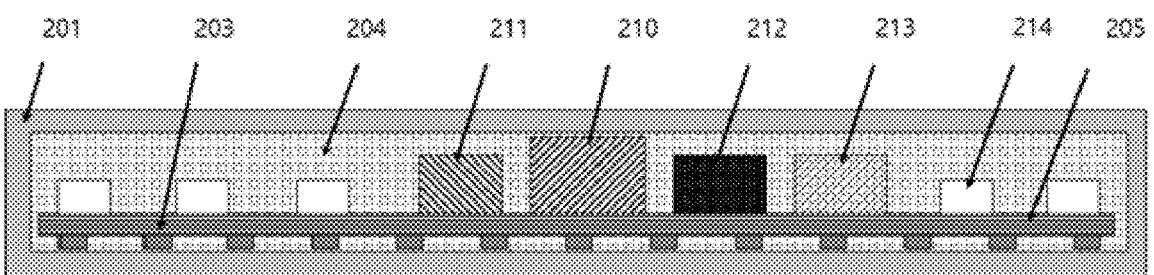
FIG. 4 to FIG. 9 are views illustrating a monitoring device according to another embodiment of the disclosure.

In another embodiment, an embossing structure 203 formed of material with a heat transfer coefficient (thermal expansion coefficient) different from the printed circuit board 205 may be formed to the printed circuit board 205 as shown in FIG. 4, thereby enhancing the tensile strength of the printed circuit board 205 to improve the flatness of the printed circuit board 205.

Figure 5:
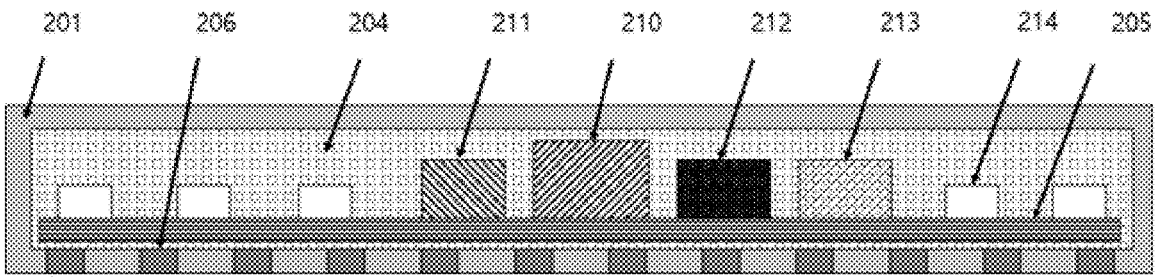

In still another embodiment, an intaglio structure 206 may be formed to the protection layer 201 and material with a stress opposed to the protection layer 201 may be filled in the intaglio structure 206 as shown in FIG. 5, thereby improving a flatness of the protection layer 201. For example, if the protection layer 201 is formed of an oxide, a nitride for enhancing a tensile strength may be filled in the intaglio structure 206 to compensate a stress because the oxide has low tensile strength.

Figure 6:
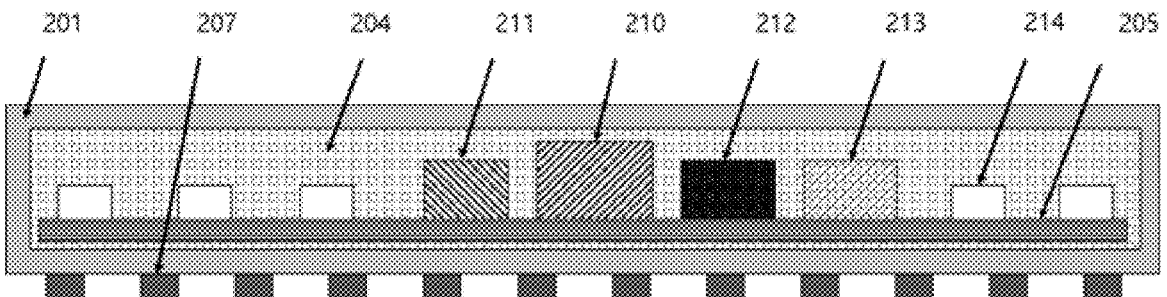

In still another embodiment, an aspect ratio stress may be improved by forming an embossing structure 207 formed of material with a heat transfer coefficient (thermal expansion coefficient) different from the protection layer 201 to the protection layer 201, as shown in FIG. 6.

Figure 7:
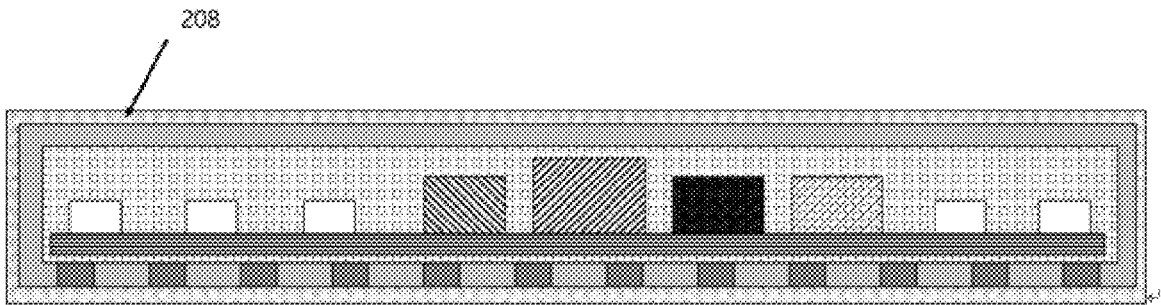
Figure 8:
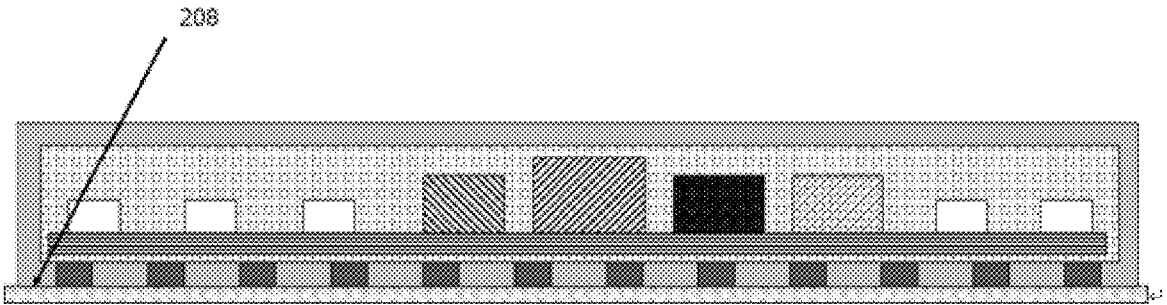

In still another embodiment, a member 208 for protecting the electrical elements from an outer environment may be formed on at least partial of the protection layer 201 as shown in FIG. 7 and FIG. 8. As a result, the electrical elements in the monitoring device 100 may be doubly protected from the outer environment. For example, the monitoring device 100 may be protected from a process gas injected into a semiconductor equipment or a display device and plasma.

For example, the member 208 may be formed of material with a heat conductivity similar to a silicon, thereby enhancing a measuring accuracy of temperature.

For another example, the member 208 may be formed of material with low heat conductivity when the monitoring device 100 monitors an object in a high temperature atmosphere, thereby protecting an electrical element vulnerable to a heat.

Figure 9:
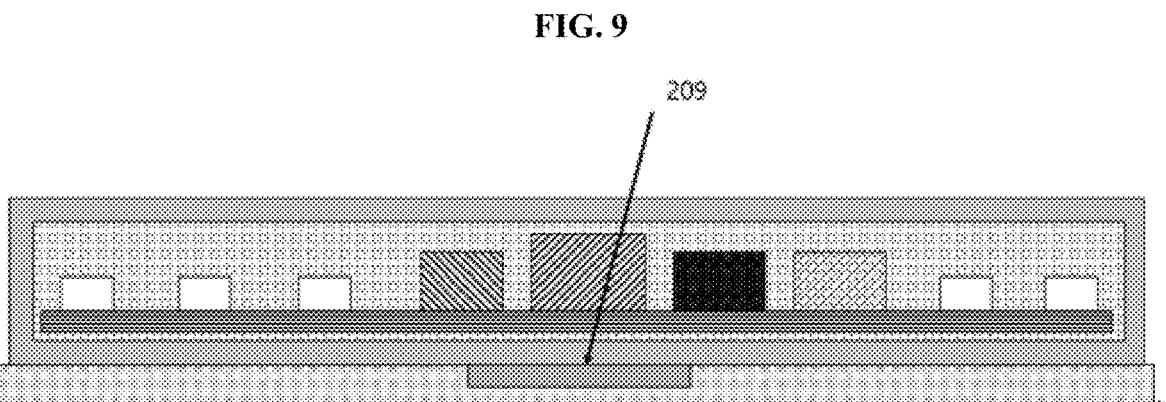

In still another embodiment, a pocket 209 may be formed in the member 208 as shown in FIG. 9, thereby protecting an electrical element vulnerable to a specific environment.

For example, the pocket 209 may be filled with material with low heat conductivity when the monitoring device 100 monitors in a high temperature environment, to protect an electrical element vulnerable to high temperature.

For another example, the pocket 209 may be filled with elastic material to protect an electrical element vulnerable to vibration.

On the other hand, the electromagnetic wave blocking layer 204 may cover the electrical elements to prevent electromagnetic wave from being propagated to the electrical elements in the protection layer 201. The electromagnetic wave blocking layer 204 may locate on one or more of an upper surface and a lower surface of the printed circuit board 205.

In an embodiment, the electromagnetic wave blocking layer 204 may be formed by using a sputtered metal (nickel, silver, gold and so on), liquid metal, a metal spray method, an electromagnetic wave blocking film, a mesh type electromagnetic wave blocking film.

Additionally, multiple layered printed circuit board is used, an uppermost layer and a lowest layer of the multiple layered printed circuit board being formed of material (copper, silver, gold and so on) used for a wire, for the purpose of using as the uppermost layer and the lowest layer as the electromagnetic wave blocking layer 204.

Moreover, the electromagnetic wave blocking layer 204 may be formed of metal such as a copper, a nickel, an aluminum, a gold, a silver, etc. or an alloy. The electromagnetic wave blocking layer 204 may be formed through a spray coating, be formed with a film tape made up of the material, be formed of liquid metal, be formed through a sputtering process or be formed with a sheet made up of the material. Here, a front surface of the sheet may be blocked or the sheet may be formed in a mesh type.

In another embodiment, a part corresponding to the wireless communication device 211 of the electromagnetic wave blocking layer 204 may be opened. This is for performing smoothly wireless communication. On the other hand, a part corresponding to an electrical sensor of the electromagnetic wave blocking layer 204 may be also opened.

The protection layer 201 and the member 208 which can function as a surface layer of the monitoring device 100 may be formed of material injectable in a chamber, for example a silicon-based material, an oxide-based material, a ceramic material, an engineering plastic, or Teflon, etc.

The microprocessor 210 may be formed on or below the printed circuit board 205, and control the operation of the wireless communication device 211, the wireless charging device 212 or at least one sensor 214.

For example, the microprocessor 210 may collect data sensed by the sensors 214 and transmit the collected data to an external device (not shown) through the wireless communication device 211.

For another example, the microprocessor 210 may receive a user setting information set by the user through the wireless communication device 211 and control the electrical elements depending on the received user setting information.

In an embodiment, every area except footprints of a wire or the elements of the printed circuit board 205 may be used as a ground plane, and thus the monitoring device 100 may have excellent noise cancelling. Additionally, the ground plane may be used as the electromagnetic wave blocking layer 204.

The wireless communication device 211 performs wireless communication with the external device and may be disposed on the printed circuit board 205. The wireless communication device 211 may transmit sensing data including temperature information, slope information, vibration information or electrical information, etc. sensed by the sensor 214 to the external device. Here, the external device may analyze the transmitted sensing data and determines abnormalities of the electrostatic chuck 112 through the analyzing.

The wireless charging device 212 may charge wirelessly the power supply device 213 embedded in the printed circuit board 205.

The sensor 214 may be formed on the printed circuit board 205 and measure temperature, slope or vibration of the electrostatic chuck 112, voltage and current generated from plasma, optical wavelength of the plasma, a distance between an upper electrode and a lower electrode in a semiconductor equipment, or DC voltage and current of electrostatic force. A temperature sensor may be used for measuring temperature as the sensor 214, a gyroscope may be used form measuring a slope, and a vibration sensor may be used for measuring vibration. A capacitor and an inductor, etc. may be used for measuring voltage and current as the sensor 214, an electrical sensor may be used for measuring an electrical signal, an optical sensor may be used for measuring wavelength of a light and a displacement sensor may be used for measuring the distance between the electrodes.

Briefly, the monitoring device 100 of the disclosure is disposed on the electrostatic chuck 112 and may monitor abnormalities of the electrostatic chuck 112 by measuring temperature, slope, vibration, voltage or current of the electrostatic chuck 112 or the distance between the electrodes. Furthermore, the monitoring device 100 may monitor RF voltage, current or power applied to the semiconductor chamber or the display chamber or light wavelength of plasma in the chamber.

The monitoring device 100 may prevent great loss by taking proper actions when it is checked that the electrostatic chuck 112 or the chamber 110 is abnormal. Specially, every wafer to which a process is performed must be discarded if preset parameter for the electrostatic chuck 112 is not kept, because the electrostatic chuck 112 for fixing the wafer affects to the process. Every wafer to which a process is performed must be discarded if preset parameter for the chamber 110 is not kept, because the chamber 110 which is a space for performing a process of manufacturing the wafer affects to the process. The monitoring device 100 may prevent great loss by diagnosing in advance these problems.

The monitoring device 100 has an improved flatness by controlling a tensile strength and a compression strength, and thus the user may lay the monitoring device 100 on the electrostatic chuck 112 using a robot in the chamber 110 without opening the chamber 110 and monitor the electrostatic chuck 112 using the monitoring device 100. If the flatness of the monitoring device 100 is low, the monitoring device 100 may be bent as shown in FIG. 13 when the robot transfers the monitoring device 100, and so the monitoring device 100 may not pass through an entrance. As a result, the monitoring device 100 may not be normally disposed on the electrostatic chuck 112.

The flatness of the monitoring device 100 may be properly adjusted depending on a measuring factor, a measuring method or a measuring environment.

On the other hand, the monitoring device 100 measures abnormalities of the electrostatic chuck 112, the semiconductor chamber or the display chamber. However, the monitoring device 100 may monitor temperature, slope or vibration of a baking chuck in a photolithography process, temperature, slope, voltage or vibration of a chuck in an implant equipment, or temperature of a high temperature chuck in a deposition process and so on. The monitoring device 100 may measure the high temperature chuck in a long distance.

The monitoring device 100 may measure temperature, vibration or slope of a photo mask used in an exposure process. Here, the monitoring device 100 may have the same structure as the monitoring device 100 described in above.

In another embodiment, the monitoring device 100 may not be physically contacted with the electrostatic chuck 112. The monitoring device 100 may monitor temperature of a high temperature chuck without being contacted with the high temperature chuck while it locates on a lift pin of the high temperature chuck, to diagnose the high temperature chuck in the deposition process.

Additionally, the monitoring device 100 may include an optical sensor for sensing a light or an electrical sensor for measuring electrical factor to monitor the object to be measured. In this case, to use the optical sensor, the monitoring 100 may have the structure described in above, but the monitoring device 100 may further include a light receiving sensor for receiving a light and hole through which the light passes may be formed on the monitoring device 100.

Furthermore, to use the electrical sensor, the monitoring device 100 includes the electrical sensor, wherein hole through which an electrical signal passes may be formed on the monitoring device 100.

In still another embodiment, an adhesion layer may be further formed to adhere the printed circuit board 205 to the member 208. Here, the protection layer 201 may function as the adhesion layer.

In still another embodiment, an intaglio pattern or an embossing pattern may be formed so as to compensate a stress vertically and horizontally to the member 208. Here, the pattern may be formed of material for compensating a thermal expansion coefficient, e.g. a thermosetting resin, an engineering plastic, a ceramic, a silicon, a microwire, etc.

Components in the embodiments described above can be easily understood from the perspective of processes. That is, each component can also be understood as an individual process. Likewise, processes in the embodiments described above can be easily understood from the perspective of components.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The invention claimed is:

1. A monitoring device comprising:

a protection layer;

a board disposed in an internal space of the protection layer; and at least one electrical element disposed on the board, wherein the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the board, material with different characteristics from the board is filled in the intaglio structure or the embossing structure is formed of material with different characteristics from the board, and the protection layer is formed of a silicon, an oxide, a ceramic, or a carbon.

2. The monitoring device of claim 1, wherein the board is a printed circuit board, and wherein material for compensating a tensile strength or a compressive stress of the board is filled in the intaglio structure or the embossing structure is formed of material for compensating the tensile strength or the compressive stress of the board, and a flatness of the board is enhanced by the compensating the tensile strength or the compressive stress.

3. The monitoring device of claim 1, wherein the different characteristics is a thermal expansion coefficient.

4. The monitoring device of claim 3, wherein the material filled in the intaglio structure is a thermosetting resin, an engineering plastic, a silicon, a copper, an aluminum, a gold or a silver as material with a thermal expansion coefficient higher than the board, or the material of the embossing structure is a thermosetting resin, an engineering plastic, a silicon, a copper, an aluminum, a gold or a silver as material with a thermal expansion coefficient higher than the board.

5. The monitoring device of claim 1, further comprising:

a member disposed outside the protection layer, wherein the member is formed of material with temperature characteristics or heat conductivity characteristics different from the protection layer, thereby enhancing a measuring accuracy of temperature or protecting an electrical element vulnerable to a heat.

6. The monitoring device of claim 5, wherein a pocket is formed to the member, and material with different heat conductivity from the member is filled in the pocket or an elastic material is formed in the pocket.

7. The monitoring device of claim 1, wherein the object is an electrostatic chuck, and the sensor measures temperature, slope, voltage, current or vibration of the electrostatic chuck.

8. The monitoring device of claim 1, wherein the board is printed circuit board, and wherein an area except a wire and footprint of the electrical element of the board is used as a ground plane.

9. The monitoring device of claim 1, wherein a wireless communication device, a light receiving sensor or an electrical sensor is disposed on the board, and a hole is formed on a part corresponding to the wireless communication device, the light receiving sensor or the electrical sensor of the protection layer.

10. A monitoring device comprising:

a protection layer;

a board disposed in an internal space of the protection layer;

at least one electrical element disposed on the board; and an electromagnetic wave blocking layer configured to cover the board and the electrical element to block an electromagnetic wave inputted from outside, wherein the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the board, material with different characteristics from the board is filled in the intaglio structure or the embossing structure is formed of material with different characteristics from the board, wherein the electrical element further includes a microprocessor, a wireless communication device and a wireless charging device other than the sensor, the microprocessor collects data measured by the sensor and transmits the collected data to an outer device through the wireless communication device, and the wireless charging device charges a battery in the board.

11. A monitoring device comprising:

a protection layer;

a board disposed in an internal space of the protection layer; and at least one electrical element disposed on the board, wherein the electrical element includes one or more sensors, the monitoring device monitors an object to be monitored by measuring at least one of a temperature, a slope, a light, a vibration, a voltage, current, a power or a pressure of the object located outside the monitoring device and a distance between the object and another element, an intaglio structure or an embossing structure is formed to the protection layer, material with different characteristics from the protection layer is filled in the intaglio structure or the embossing structure is formed of material with different characteristics from the protection layer, the material filled in the intaglio structure or the material of the embossing structure is a nitride, or a carbon material or a silicon which is material with a stress opposed to the protection layer.

12. The monitoring device of claim 11, wherein the board is a printed circuit board, and wherein material for compensating a tensile strength or a compressive stress of the protection layer is filled in the intaglio structure or the embossing structure is formed of material for compensating the tensile strength or the compressive stress of the protection layer, and a flatness of the protection layer is enhanced by the compensating the tensile strength or the compressive stress.

13. The monitoring device of claim 11, further comprising:

a member disposed outside the protection layer, wherein the member is formed of material with temperature characteristics or heat conductivity characteristics different from the protection layer, thereby enhancing a measuring accuracy of temperature or protecting an electrical element vulnerable to a heat.

14. A monitoring device comprising:

a protection layer;

a board disposed in an internal space of the protection layer;

at least one electrical element disposed on the board; and a member disposed outside the protection layer and configured to protect doubly the electrical element in company with the protection layer, wherein the electrical element includes one or more sensors, and the monitoring device monitors an object to be monitored by measuring at least one of a temperature, a slope, a light, a vibration, a voltage, current, a power or a pressure of the object located outside the monitoring device and a distance between the object and another element.

15. The monitoring device of claim 14, wherein an intaglio pattern or an embossing pattern is formed to the member, thereby compensating a stress applied vertically and horizontally to the member.

16. The monitoring device of claim 15, wherein the pattern is formed of a thermosetting resin, an engineering resin, a ceramic, a silicon or a microwire to compensate a thermal expansion coefficient of the member.

17. The monitoring device of claim 14, wherein a pocket is formed to the member, and wherein material with different heat conductivity from the member is filled in the pocket or elastic material is filled in the pocket.

* * * * *